United States Patent
Cao et al.

(10) Patent No.: US 9,602,118 B2
(45) Date of Patent: Mar. 21, 2017

(54) AMPLIFIER SHARING TECHNIQUE FOR POWER REDUCTION IN ANALOG-TO-DIGITAL CONVERTER

(71) Applicant: Texas Instruments Incorporated, Dallas, TX (US)

(72) Inventors: Peng Cao, Richardson, TX (US); Amit Kumar Gupta, Frisco, TX (US); Venkata Krishnan Kidambi Srinivasan, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/231,166

(22) Filed: Aug. 8, 2016

(65) Prior Publication Data

US 2017/0041012 A1    Feb. 9, 2017

Related U.S. Application Data

(60) Provisional application No. 62/202,621, filed on Aug. 7, 2015.

(51) Int. Cl.
| H03M 1/00 | (2006.01) |
| H03M 1/08 | (2006.01) |
| H03M 1/12 | (2006.01) |
| H03M 3/00 | (2006.01) |

(52) U.S. Cl.
CPC .......... *H03M 1/08* (2013.01); *H03M 1/1245* (2013.01); *H03M 3/458* (2013.01)

(58) Field of Classification Search
CPC ........ H03M 1/12; H03M 1/802; H03M 1/804; H03M 1/806; H03M 1/203; H03M 1/207; H03M 1/06; H03M 1/1023; H03M 1/46; H03M 1/124
USPC ................................ 341/155, 122, 143, 141
See application file for complete search history.

(56) References Cited

U.S. PATENT DOCUMENTS

| 7,486,217 B2 * | 2/2009 | Matsushita | H03M 1/005 |
| | | | 341/143 |
| 7,961,129 B2 * | 6/2011 | Ceballos | H03M 3/412 |
| | | | 341/143 |
| 8,212,700 B2 * | 7/2012 | Zoso | H03M 3/422 |
| | | | 341/143 |
| 2002/0118128 A1 * | 8/2002 | Siferd | H03M 3/47 |
| | | | 341/141 |
| 2011/0318205 A1 * | 12/2011 | Aso | F04B 13/00 |
| | | | 417/437 |

* cited by examiner

*Primary Examiner* — Jean B Jeanglaude
(74) *Attorney, Agent, or Firm* — Gregory J. Albin; Charles A. Brill; Frank D. Cimino

(57) ABSTRACT

A dual delta-sigma modulator includes a first modulator, a second modulator, and a shared amplifier coupled to the first and second modulators. The first modulator includes an integrator configured to generate a first modulator output signal. The second modulator includes a second integrator configured to generate a second modulator output signal. The shared amplifier is configured to assist the first integrator integrating a difference between a first analog input signal and a first modulator output signal from the first modulator during a first period of time and to assist the second integrator integrate a difference between a second analog input signal and a second modulator output signal from the second modulator during a second period of time.

20 Claims, 4 Drawing Sheets

AMPLIFIER SHARING TECHNIQUE FOR POWER REDUCTION IN ANALOG-TO-DIGITAL CONVERTER

CROSS-REFERENCE TO RELATED APPLICATIONS

The present application claims priority to U.S. Provisional Patent Application No. 62/202,621, filed Aug. 7, 2015, titled "Amplifier Sharing Technique For Power Reduction In Delta-Sigma ADC," which is hereby incorporated herein by reference in its entirety.

BACKGROUND

Delta-sigma analog-to-digital converters (ADCs) are utilized in a wide variety of applications to convert analog signals into digital signals. A delta-sigma ADC conventionally consists of a single delta-sigma modulator followed by a digital decimation filter to produce a high resolution data stream digital output. Single channel ADCs conventionally include a single ADC configured to convert a single analog input signal into a single digital output signal. Multiple channel ADCs conventionally include multiple exact ADC copies that sample at the same clock phase. Each of the multiple ADC copies then receives an analog input signal, and each produces a digital output signal.

SUMMARY

The problems noted above are solved in large part by systems and methods of converting an analog signal to a digital signal. In some embodiments, a dual delta-sigma ADC includes a dual delta-sigma modulator and a decimation filter. The dual delta-sigma modulator is configured to receive an analog input signal. The dual delta-sigma modulator includes a first modulator, a second modulator, and a shared operational amplifier. The first modulator includes a first integrator configured to integrate the difference between the analog input signal and a first modulator output signal during a first period of time, hold a first integrator output value during a second period of time, and generate a first modulator output signal. The second modulator includes a second integrator configured to hold a second integrator output value during the first period of time, integrate a difference between the analog input signal and a current modulator output signal of the second modulator during the second period of time, and generate a second modulator output signal. The shared operational amplifier is configured to assist the first integrator's integration operation during the first period of time and to assist the second integrator's integration operation during the second period of time. The interleaver is configured to receive and interleave the first modulator output signal and the second modulator output signal to generate an interleaved output signal. The decimation filter is configured to filter the quantization noise in the interleaved output signal and decimate the interleaved output signal to generate a high resolution digital output signal in a given data rate.

Another illustrative embodiment is a delta-sigma modulator includes a first modulator, a second modulator, and a shared operational amplifier to assist the first and second modulator alternatively. The first modulator includes a first integrator is configured to generate a first modulator output signal. The second modulator is configured to generate a second modulator output signal. The shared amplifier is configured to assist a first integrator of the first modulator integrate during a first period of time and to assist a second integrator of the second modulator integrate during a second period of time.

Yet another illustrative embodiment is a method of converting an analog signal to a digital signal. The method includes receiving, by a first modulator and a second modulator, an analog input signal. The method also includes, during a first period of time, integrating, by a first integrator in the first modulator, the difference between the analog input signal and a first modulator output signal utilizing a shared operational amplifier assisting the first and second modulators. The method also includes, during the first period of time, holding, by a second integrator in the second modulator, a second integrator output value. The method also includes, during a second period of time that is exclusive of the first period of time, integrating, by the second integrator, the difference between the analog input signal and a second modulator output signal utilizing the shared operational amplifier. The method also includes, during the second period of time, holding, by the first integrator, a first integrator output value.

BRIEF DESCRIPTION OF THE DRAWINGS

For a detailed description of various examples, reference will now be made to the accompanying drawings in which.

NOTATION AND NOMENCLATURE

Figure 1A:
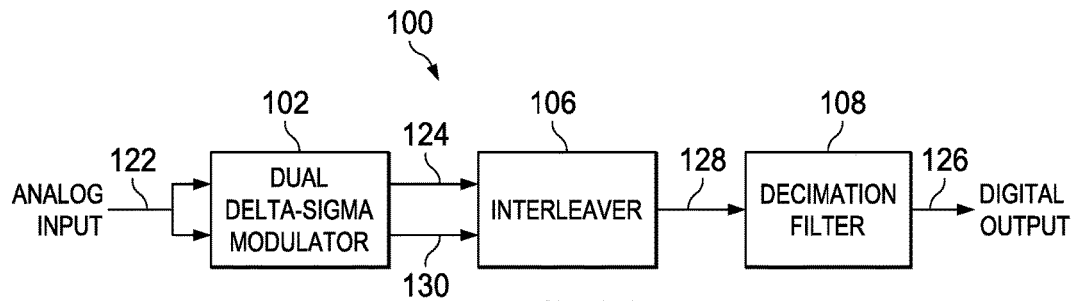
FIG. 1A shows an illustrative block diagram of a single channel delta-sigma analog-to-digital converter in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to. . . . " Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Delta-sigma ADCs are utilized in a wide variety of applications to convert analog signals into digital signals. Single channel delta-sigma ADCs conventionally include a single ADC configured to convert a single analog input signal into a single digital output signal. To increase signal-to-noise ratio (SNR) in a conventional single-channel ADC, the KT/C noise is reduced. In some conventional systems, in order to reduce this noise, the sampling capacitor of the modulator may be increased. In other conventional systems, two ADCs are placed in parallel with the two digital outputs averaged to generate a digital output with a better SNR (in some cases, a 3 dB better SNR). In each case, the first integrator of the modulator dominates the total power consumption of the ADC. Therefore, increasing the sampling capacitor size and/or placing two ADCs in parallel increases power consumption of the system. Multiple channel delta-sigma ADCs conventionally include multiple exact ADC copies that sample at the same clock phase. Each of the multiple ADC copies then receives an analog input signal, and each produces a digital output signal. Thus, power consumption of the system is equal to N times that of utilizing a single ADC, where N is the number of ADC copies.

In both single channel and multiple channel conventional delta-sigma ADCs, the amplifier in the first integrator of the modulator demands high power during the integrating phase only. Additionally, amplifier power requirements during the non-integrating phase (hold phase) are much less. Thus, the conventional delta-sigma ADC which includes the high power amplifier in each ADC consumes more power than required.

In accordance with the disclosed principles, a delta-sigma ADC includes a delta-sigma modulator that includes two individual modulators operating on opposite sampling phases that share an operational amplifier. While one of the two modulators is in the integrating phase, it utilizes the shared operational amplifier for integrating. At the same time, the second of the two modulators utilizes a low power amplifier to hold its previous output value of its first integrator. However, when the second of the two modulators is in the integrating phase, it utilizes the shared operational amplifier for integrating while the first modulator utilizes a low power amplifier to hold its previous value of its first integrator. In this way, power consumption may be reduced while SNR may be increased.

FIG. 1A shows an illustrative block diagram of a single channel delta-sigma analog-to-digital converter (ADC) 100 in accordance with various embodiments. The delta-sigma ADC 100 is configured to receive an analog input signal 122 and convert the analog input signal 122 into a corresponding digital output signal 126. Delta-sigma ADC 100 may include dual delta-sigma modulator 102, interleaver 106, and decimation filter 108. The delta-sigma modulator 102 is configured to receive the analog input signal 122 and generate two modulator output signals 124 and 130. More particularly, delta-sigma modulator 102 may be configured to digitize the analog input signal 122 and reduce quantization noise at lower frequencies. For example, the delta-sigma modulator 102 may implement noise shaping to push low frequency quantization noise to higher frequencies outside of a frequency band of interest, thus making KT/C noise the dominant noise source for signal-to-noise ratio (SNR). In some embodiments, the analog input signal 122 is a time-varying analog voltage. For example, the analog input signal may be a voltage in the form of a sine wave, such that the voltage amplitude changes with time. In some embodiments, the analog input signal 122 that feeds the delta-sigma modulator 102 may be a differential pair of signals. In other words, analog input signal 122 may include a pair of the same signal, except that the differential pair of signals are 180 degrees out of phase with each other.

The modulator output signals 124 and 130 are then fed into the interleaver 106. In some embodiments, the interleaver 106 is an electric circuit configured to interleave the two modulator output signals 124 and 130. For example, the interleaver 106 may generate interleaved output signal 128 that comprises modulator output signals 124 followed by the other of the two modulator output signals 130. Thus, the interleaved output signal 128 is a single signal that switches between the modulator output signals 124 and 130. Interleaver 106 may be any type of interleaver including a digital multiplexer (MUX).

Decimation filter 108 may receive the interleaved output signal 128 and/or, in some embodiments, the modulated output signals 124 and 130 directly without interleaving. Decimation filter 108 may be an electric circuit that is configured to filter the interleaved output signal 128 and/or modulated output signals 124 and 130 to attenuate high frequency out of band noise in the interleaved output signal 128 and/or individual output signals 124 and 130 and then decimate the filtered output for a given rate, thus, generating a high resolution digital output signal 126.

Figure 1B:
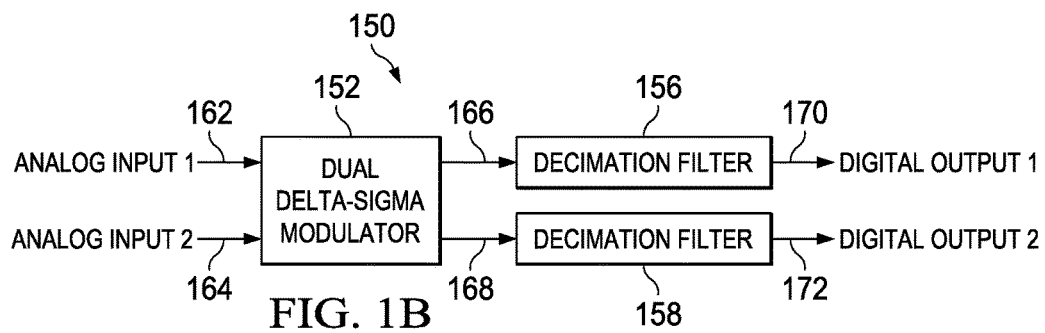
FIG. 1B shows an illustrative block diagram of a multiple channel delta-sigma analog-to-digital converter in accordance with various embodiments.

FIG. 1B shows an illustrative block diagram of a multiple channel delta-sigma analog-to-digital converter (ADC) 150 in accordance with various embodiments. The delta-sigma ADC 150 is configured to receive two analog input signals 162 and 164 and convert the analog input signals 162 and 164 into corresponding digital output signals 170 and 172. Delta-sigma ADC 150 may include dual delta-sigma modulator 152 and decimation filters 156 and 158. The delta-sigma modulator 152 is configured to receive the analog input signals 162 and 164 and generate two modulator output signals 166 and 168. More particularly, delta-sigma modulator 152 may be configured to digitize the analog input signals 162 and 164 and reduce quantization noise at lower frequencies. For example, the delta-sigma modulator 152 may implement noise shaping to push low frequency quantization noise to higher frequencies outside of a frequency band of interest, thus making KT/C noise the dominant noise source for signal-to-noise ratio (SNR). In some embodiments, the analog input signals 162 and 164 are time-varying analog voltages. For example, the analog input signals 162 and 164 may be a voltage in the form of a sine wave, such that the voltage amplitude changes with time. In some embodiments, the analog input signals 162 and 164 that feed the delta-sigma modulator 152 may be a differential pair of signals. In other words, analog input signals 162 and 164 may include a pair of the same signal, except that the differential pair of signals are 180 degrees out of phase with each other.

The modulator output signals 166 and 168 are then fed into the decimation filters 156 and 158. More particularly, modulator output signal 166 is received by decimation filter 156 and modulator output signal 168 is received by decimation filter 158. Decimation filter 156 may be an electric circuit that is configured to filter the modulator output signal 166 to attenuate high frequency out of band noise in the modulator output signal 166 and then decimate the filtered output for a given rate, thus, generating a high resolution digital output signal 170. Similarly, decimation filter 158 may be an electric circuit that is configured to filter the modulator output signal 168 to attenuate high frequency out of band noise in the modulator output signal 168 and then decimate the filtered output for a given rate, thus, generating a high resolution digital output signal 172.

Figure 2:
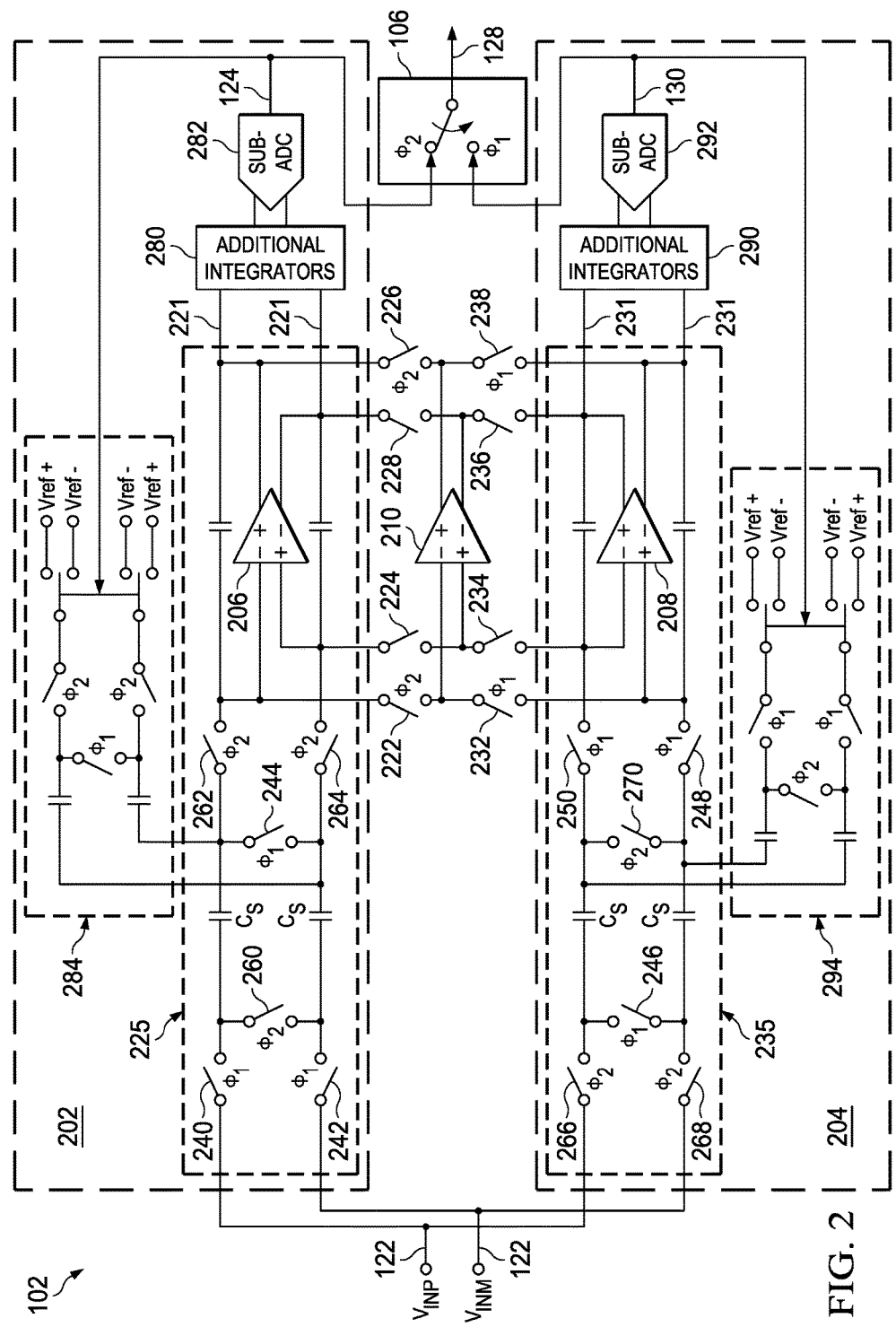
FIG. 2 shows an illustrative circuit diagram of a single channel delta-sigma modulator and an interleaver in accordance with various embodiments.

FIG. 2 shows an illustrative circuit diagram of single channel dual delta-sigma modulator 102 and interleaver 106 in accordance with various embodiments. The delta-sigma modulator 102 may include modulator 202, modulator 204, and shared operational amplifier 210. Because the delta-sigma modulator 102 shown in FIG. 2 is a single channel modulator, a single analog input signal 122, shown as the differential signal pair $V_{INP}$ and $V_{INM}$ are received by the modulator 102. More particularly, the analog differential signal pair $V_{INP}$ and $V_{INM}$ are received by the two modulators 202 and 204.

Modulator 202 may comprise integrator 225, additional integrators 280, sub-ADC 282, and switched capacitor digital-to-analog converter (DAC) 284. Modulator 204 may comprise integrator 235, additional integrators 290, sub-ADC 292, and switched capacitor DAC 294. Each of the modulators 202 and 204 receives sampling clocks, labelled $\Phi_1$, and $\Phi_2$ which are non-overlapping (e.g., when $\Phi_1$ is HIGH, $\Phi_2$ is LOW and when $\Phi_2$ is HIGH, $\Phi_2$ is LOW and $\Phi_1$, and $\Phi_2$ are not HIGH at the same time). The sampling clock $\Phi_1$ is timed such that when HIGH, integrator 225 in modulator 202 integrates the difference between analog input signal 122 and modulator output signal 124. For example, when $\Phi_1$ is HIGH, switches 240-250, included in integrators 225 and 235, are configured to be closed while switches 260-270, also included in integrators 225 and 235, are configured to be open. In this configuration, the integrator 225 has two inputs for integration, the analog input signal 122 and an analog version of the modulator output signal 124. The integrator 225 then integrates the difference between the analog input signal 122 and the modulator output signal 124 to generate the integrator output signal 221. Additional integrators 280, which may be one or more electric circuits that can perform integration, receives the integrator output signal 221 and process the integrator output signal 221 for the sub-ADC 282, in some embodiments in multiple stages. The output of the additional integrators 280 is received by the sub-ADC 282. The sub-ADC 282 is any electric circuit that can convert an analog signal into a digital signal which could be single or multiple bits. Thus, the sub-ADC 282 is configured to convert the received analog signal from the additional integrators 280 into a digital version of the modulator output signal 124. The digital version of the modulator output signal 124 is received by the switch capacitor DAC 284. The switched capacitor DAC 284 is any electric circuit that can convert a digital signal into an analog signal. Thus, the switched capacitor DAC 284 is configured to convert the digital version of the modulator output signal 124 into an analog version of the modulator output signal 124 as an input into integrator 225. In this way, integrator 225 integrates the difference between analog input signal 122 and modulator output signal 124.

When $\Phi_2$ is HIGH, integrator 235 integrates the difference between analog input signal 122 and modulator output signal 130. For example, when $\Phi_2$ is HIGH, switches 260-270 are configured to be closed while switches 240-250 are configured to be open. In this configuration, the integrator 235 has two inputs for integration, the analog input signal 122 and an analog version of the modulator output signal 130. The integrator 235 then integrates the difference between the analog input signal 122 and the modulator output signal 130 to generate the integrator output signal 231. Additional integrators 290, which may be one or more electric circuits that can perform integration, receives the integrator output signal 231 and process the integrator output signal 231 for the sub-ADC 292, in some embodiments in multiple stages. The output of the additional integrators 290 is received by the sub-ADC 292. The sub-ADC 292 is any electric circuit that can convert an analog signal into a digital signal which could be single or multiple bits. Thus, the sub-ADC 292 is configured to convert the received analog signal from the additional integrators 290 into a digital version of the modulator output signal 130. The digital version of the modulator output signal 130 is received by the switch capacitor DAC 294. The switched capacitor DAC 294 is any electric circuit that can convert a digital signal into an analog signal. Thus, the switched capacitor DAC 294 is configured to convert the digital version of the modulator output signal 130 into an analog version of the modulator output signal 130 as an input into integrator 235. In this way, integrator 235 integrates the difference between analog input signal 122 and modulator output signal 130.

Furthermore, the sampling clocks $\Phi_1$ and $\Phi_2$ also drive the switching of switches 222-228 and 232-238. Switches 222-224 are a pair of switches controlled by $\Phi_2$. Similarly, switches 226-228 are a pair of switches controlled by $\Phi_2$ as well. Switches 232-234 are a pair of switches controlled by $\Phi_1$. Similarly, switches 236-238 are a pair of switches controlled by $\Phi_1$ as well. Thus, when $\Phi_1$ is HIGH, switches 232-238 are configured to be closed while switches 222-228 are configured to be open, and when $\Phi_2$ is HIGH, switches 222-228 are configured to be closed while switches 232-238 are configured to be open. Due to the switching of switches 222-228 and 232-238, shared operational amplifier 210 is shared by the two integrators 225 and 235, and thus, shared by the two modulators 202-204. Shared operational amplifier 210 may be, in some embodiments, an operational transconductance amplifier (OTA) whose differential input voltage produces an output current or any other type of operational amplifier. Thus, shared operational amplifier 210 may assist the integration operation of the integrators 225 and 235. In this configuration, when $\Phi_1$ is HIGH (and thus $\Phi_2$ is LOW), integrator 225 operates to integrate the difference between analog input signal 122 and modulator output signal 124 utilizing the shared operational amplifier 210 and a low power operational amplifier 206 included in integrator 225. Thus, during the period of time that $\Phi_1$ is HIGH, integrator 225 utilizes the shared operational amplifier 210 in combination with low power operational amplifier 206 to integrate the difference between analog input signal 122 and the current modulator output signal 124 to generate the integrator output signal 221 which, after being processed by the additional integrators 280 and converted by the sub-ADC 282 becomes the next modulator output signal 124. When $\Phi_2$ is HIGH (and thus $\Phi_1$ is LOW), integrator 235 operates to integrate the difference between the analog input signal 122 and the modulator output signal 130 utilizing the shared operational amplifier 210 and a low power operational amplifier 208 included in integrator 235. Thus, during the period of time that $\Phi_2$ is HIGH, integrator 235 utilizes the shared operational amplifier 210 in combination with low power operational amplifier 208 to integrate the difference between analog input signal 122 and the current modulator output signal 124 to generate the integrator output signal 231 which, after being processed by the additional integrators 290 and converted by the sub-ADC 292 becomes the next modulator output signal 130.

However, when $\Phi_1$ is HIGH (and thus $\phi_2$ is LOW), integrator 235 operates to hold its output value the previous cycle utilizing the low power operational amplifier 208 included in integrator 235 without assistance from the shared operational amplifier 210. In other words, integrator 235 operates to hold the value of the integrator output signal 231 when $\Phi_1$ is HIGH. Similarly, when $\Phi_2$ is HIGH (and thus $\Phi_1$ is LOW), integrator 225 operates to hold its output value from the previous cycle utilizing the low power operational amplifier 206 included in integrator 225 without assistance from shared operational amplifier 210. In other words, integrator 225 operates to hold the value of the integrator output signal 221 when $\Phi_2$ is HIGH.

The power consumption needed to hold the value of the integrated output signal 221 or 231 is significantly less than the power needed to integrate the difference between the analog input signal 122 and the modulator output signal 124 or 130. For example, of the total first integrator power (i.e., the power consumed by integrators 225 and 235) of the delta-sigma modulator 102, approximately 85% (i.e., 80%-90%) of the integrator power may be consumed by the shared operational amplifier 210 in combination with either low power operational amplifier 206 or 208 depending on which of integrators 225 or 235 is integrating and therefore utilizing the shared operational amplifier 210. In contrast, the remaining approximately 15% (i.e., 10%-20%) of the total first integrator power of the delta-sigma modulator 102 is consumed by low power operational amplifier 206 or 208 that is included in the integrator that is not integrating (i.e., holding). In this way, an operational amplifier (such as shared operational amplifier 210) may be shared between the two integrators 225 and 235, and thus, shared between the two modulators 202-204.

Interleaver 106 is configured to receive both modulator output signals 124 and 130 and the sampling clock signals $\Phi_1$ and $\Phi_2$. When $\Phi_1$ is HIGH, then the interleaver 106 is configured to pass the modulator output signal 124 as the interleaved output signal 128. However, when $\Phi_2$ is HIGH, then the interleaver 106 is configured to pass the modulator output signal 130 as the interleaved output signal 128. In this way, a combined modulator output signal is generated by the interleaver 106.

Figure 3:
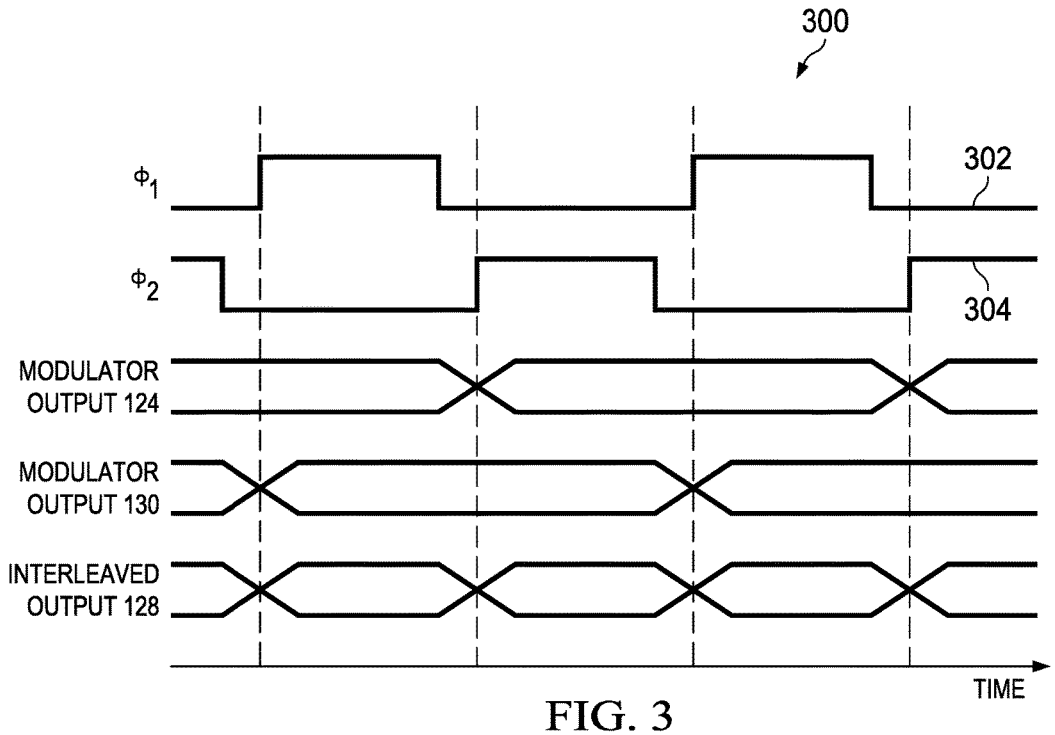
FIG. 3 shows an illustrative timing diagram of various signals of a single channel delta-sigma analog-to-digital converter in accordance with various embodiments.

FIG. 3 shows an illustrative timing diagram 300 of various signals 302-304, 124, 130, and 128 of a single channel delta-sigma analog-to-digital converter 100 in accordance with various embodiments. In FIG. 3, signal 302 represents an example sampling clock $\Phi_1$ while signal 304 represents an clock $\Phi_2$. Modulator output signals 124 and 130 are the digital output signal from the two modulators representing the same analog input signal 122. As discussed above, modulator output signals 124 and 130 are combined by interleaver 106 to generate the interleaved output signal 128 for the differential analog input pair. When $\Phi_1$ is HIGH, $\Phi_2$ is LOW and vice versa because $\Phi_1$ and $\Phi_2$ are non-overlapping. Thus, the data rate of the interleaved output signal 128 is two times the sampling clock frequency of $\Phi_1$, and $\Phi_2$. In order to generate a digital output signal 126 that is at the sampling clock frequency, decimation filter 108 may filter the interleaved output signal 128 and decimate by a two times over-sampling ratio (OSR) for a single conventional modulator. Thus, the output data rate of the digital output signal 126 is the same as if the delta-sigma modulator 102 had only a single modulator. By utilizing two modulators (modulators 202-204) in the delta-sigma modulator 102, SNR may be gained. In some embodiments, as much as 3 dB SNR may be gained. Additionally, because the operational amplifier 210 is shared by the two modulators 202-204, a very modest increase in power consumption as compared to a single modulator design is added. Thus, the design of delta-sigma modulator 102 increases SNR at a low power cost. In fact, in some embodiments, only 20% gain in power requirements leads to an increase of 3 dB in SNR while in a conventional system, a 3 dB gain in SNR would require an almost 100% increase in power usage.

Figure 4:
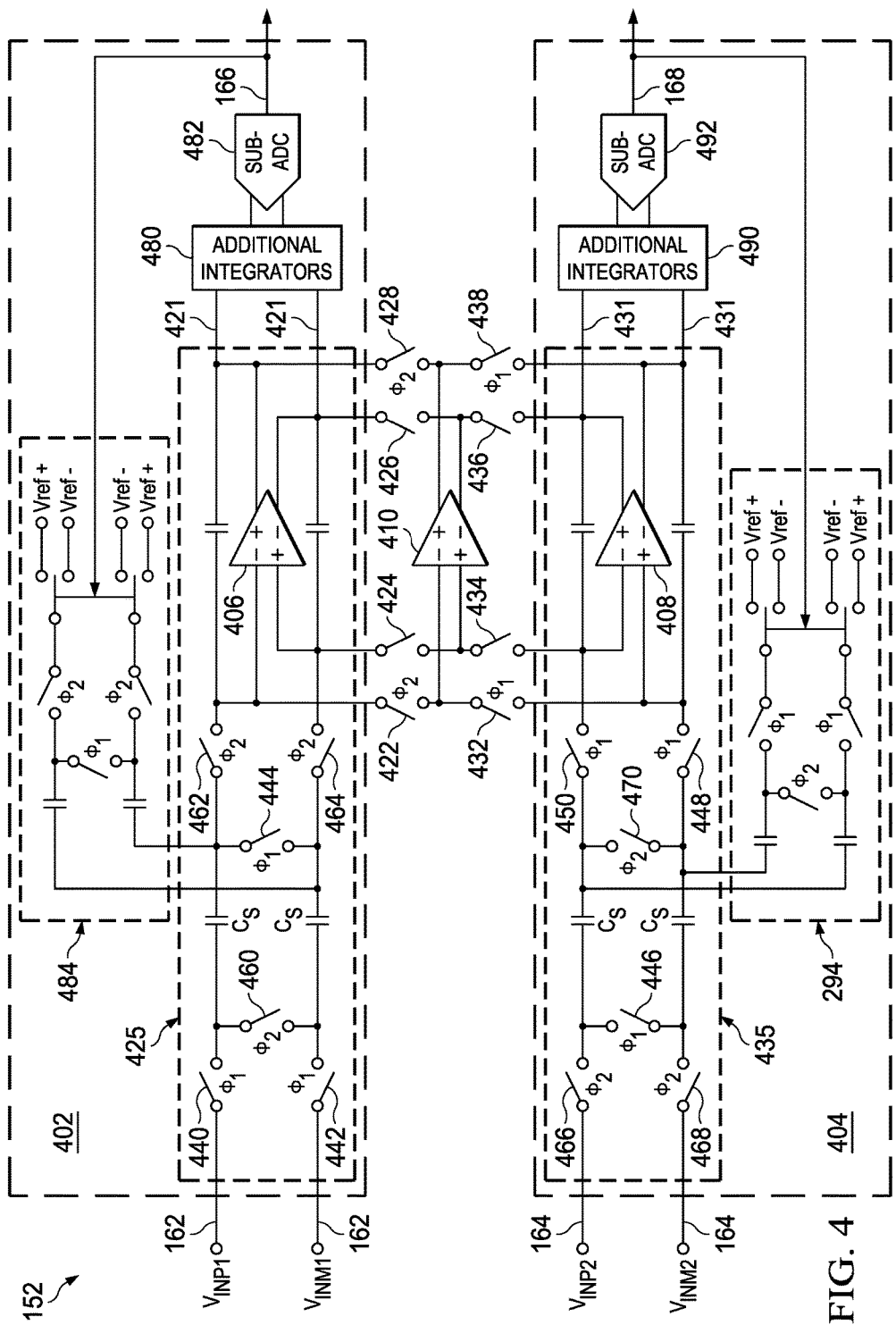
FIG. 4 shows an illustrative circuit diagram of a multiple channel delta-sigma modulator in accordance with various embodiments.

FIG. 4 shows an illustrative circuit diagram of a multiple channel dual delta-sigma modulator 152 in accordance with various embodiments. The multiple channel delta-sigma modulator 152 may include modulator 402, modulator 404, and shared operational amplifier 410. Because the delta-sigma modulator 152 shown in FIG. 4 is a multiple channel modulator, each modulator 402-404 receives an analog input signal 162 or 164, shown as the differential signal pairs $V_{INP1}$ and $V_{INM1}$ and $V_{INP2}$ and $V_{INM2}$. More particularly, the analog input signal 162, shown as analog differential signal pair $V_{INP1}$ and $V_{INM1}$, is received by modulator 402 while the analog input signal 164, shown as analog differential signal pair $V_{INP2}$ and $V_{INM2}$, is received by the modulator 404.

Modulator 402 may comprise integrator 425, additional integrators 480, sub-ADC 482, and switched capacitor DAC 484. Modulator 404 may comprise integrator 435, additional integrators 490, sub-ADC 492, and switched capacitor DAC 494. Like, the modulators 202-204, each of modulators 402-404 receives sampling clocks $\Phi_1$ and $\Phi_2$ which are non-overlapping. The sampling clock $\Phi_1$ is timed such that when HIGH, integrator 425 in modulator 402 integrates the difference between analog input signal 162 and modulator output signal 166. For example, when $\Phi_1$ is HIGH, switches 440-450, included in integrators 425 and 435, are configured to be closed while switches 460-470, also included in integrators 425 and 435, are configured to be open. In this configuration, the integrator 425 has two inputs for integration, the analog input signal 162 and an analog version of the modulator output signal 166. The integrator 425 then integrates the difference between the analog input signal 162 and the modulator output signal 166 to generate the integrator output signal 421. Additional integrators 480, which may be one or more electric circuits that can perform integration, receives the integrator output signal 421 and process integrator output signal 421 for the sub-ADC 482, in some embodiments in multiple stages. The output of the additional integrators 480 is received by the sub-ADC 482. The sub-ADC 482 is any electric circuit that can convert an analog signal into a digital signal with single or multiple bits. Thus, the sub-ADC 482 is configured to convert the received analog signal from the additional integrators 480 into a digital version of the modulator output signal 166. The digital version of the modulator output signal 166 is received by the switch capacitor DAC 484. The switched capacitor DAC 484 is any electric circuit that can convert a digital signal into an analog signal. Thus, the switched capacitor DAC 484 is configured to convert the digital version of the modulator output signal 166 into an analog version of the modulator output signal 166 as an input into integrator 425. In this way, integrator 425 integrates the difference between analog input signal 162 and modulator output signal 166.

When $\Phi_2$ is HIGH, integrator 435 integrates the difference between analog input signal 164 and modulator output signal 168. For example, when $\Phi_2$ is HIGH, switches 460-470 are configured to be closed while switches 440-450 are configured to be open. In this configuration, the integrator 435 has two inputs for integration, the analog input signal 164 and an analog version of the modulator output signal 168. The integrator 435 then integrates the difference between the analog input signal 164 and the modulator output signal 168 to generate the integrator output signal 431. Additional integrators 490, which may be one or more electric circuits that can perform integration, receives the integrator output signal 431 and process the integrator output signal 431 for the sub-ADC 492, in some embodiments in multiple stages. The output of the additional integrators 490 is received by the sub-ADC 492. The sub-ADC 492 is any electric circuit that can convert an analog signal into a digital signal with single or multiple bits. Thus, the sub-ADC 492 is configured to convert the received analog signal from the additional integrators 490 into a digital version of the modulator output signal 168. The digital version of the modulator output signal 168 is received by the switch capacitor DAC 494. The switched capacitor DAC 494 is any electric circuit that can convert a digital signal into an analog signal. Thus, the switched capacitor DAC 494 is configured to convert the digital version of the modulator output signal 168 into an analog version of the modulator output signal 168 as an input into integrator 435. In this way, integrator 435 integrates the difference between analog input signal 164 and modulator output signal 168.

Furthermore, the sampling clocks $\Phi_1$ and $\Phi_2$ also drive the switching of switches 422-428 and 432-438. Switches 422-424 are a pair of switches controlled by $\Phi_2$. Similarly, switches 426-428 are a pair of switches controlled by $\Phi_2$ as well. Switches 432-434 are a pair of switches controlled by $\Phi_1$. Similarly, switches 436-438 are a pair of switches controlled by $\Phi_1$ as well. Thus, when $\Phi_1$ is HIGH, switches 432-438 are configured to be closed while switches 422-428 are configured to be open, and when $\Phi_2$ is HIGH, switches 422-428 are configured to be closed while switches 432-438 are configured to be open. Due to the switching of switches 422-428 and 432-438, operational amplifier 410 is shared by the two integrators 425 and 435, and thus, shared by the two modulators 402-404. Shared operational amplifier 410 may be similar to shared operational amplifier 210 and, in some embodiments, an operational transconductance amplifier (OTA) whose differential input voltage produces an output current or any other type of operational amplifier. Thus, shared operational amplifier 410 may assist the integrating operation of the integrators 425 and 435. In this configuration, when $\Phi_1$ is HIGH (and thus $\Phi_2$ is LOW), integrator 425 operates to integrate the difference between analog input signal 162 and the modulator output signal 166 utilizing the shared operational amplifier 410 and a low power operational amplifier 406 included in integrator 425. Thus, during the period of time that $\Phi_1$ is HIGH, integrator 425 utilizes the shared operational amplifier 410 in combination with low power operational amplifier 406 to integrate the difference between analog input signal 162 and the current modulator output signal 166 to generate the integrator output signal 421 which, after being processed by the additional integrators 480 and converted by the sub-ADC 482 becomes the next modular output signal 166. When $\Phi_2$ is HIGH (and thus $\Phi_1$ is LOW), integrator 435 operates to integrate the difference between analog input signal 164 and the modulator output signal 168 utilizing the shared operational amplifier 410 and a low power operational amplifier 408 included in integrator 435. Thus, during the period of time that $\Phi_2$ is HIGH, integrator 435 utilizes the shared operational amplifier 410 in combination with low power operational amplifier 408 to integrate the difference between analog input signal 164 and the current modular output signal 168 to generate the integrator output signal 431 which, after being processed by the additional integrators 490 and converted by the sub-ADC 492 becomes the next modular output signal 168.

However, when $\Phi_1$ is HIGH (and thus $\Phi_2$ is LOW), integrator 435 operates to hold the its output value from the previous cycle utilizing the low power operational amplifier 408 included in integrator 435 without assistance from the shared operational amplifier 410. In other words, integrator 435 operates to hold the value of the integrator output signal 431 when $\Phi_1$ is HIGH. Similarly, when $\Phi_2$ is HIGH (and thus $\Phi_1$ is LOW), integrator 425 operates to hold its output value from the previous cycle utilizing the low power operational amplifier 406 included in integrator 425 without assistance from shared operational amplifier 410. In other words, integrator 425 operates to hold the value of the previous integrator output signal 421 when $\Phi_2$ is HIGH.

The power consumption needed to hold the power consumption needed to hold the value of the integrated output signal 421 or 431 is significantly less than the power consumption needed to integrate the difference between the analog input signals 162 or 164 and the modulator output signals 166 or 168. For example, of the total amplifier power of the delta-sigma modulator 152, approximately 85% (i.e., 80%-90%) of the total first integrator power (i.e., the power consumed by integrators 425 and 435) may be consumed by the shared operational amplifier 410 in combination with either low power operational amplifier 406 or 408 depending on which of integrators 425 or 435 is integrating and therefore utilizing the shared operational amplifier 410. In contrast, the remaining approximately 15% (i.e., 10%-20%) of the total first integrator power of the delta-sigma modulator 152 is consumed by low power operational amplifier 406 or 408 that is included in the integrator that is not integrating (i.e., holding). In this way, an operational amplifier (such as shared operational amplifier 410) may be shared between the two integrators 425 and 435, and thus, shared between the two modulators 402-404 in a multiple channel delta-sigma ADC. Unlike the single channel delta-sigma ADC described in FIGS. 2 and 3, the multiple channel delta-sigma ADC generates two separate outputs. Therefore, the modulator outputs 166 and 168 are not interleaved.

Figure 5:
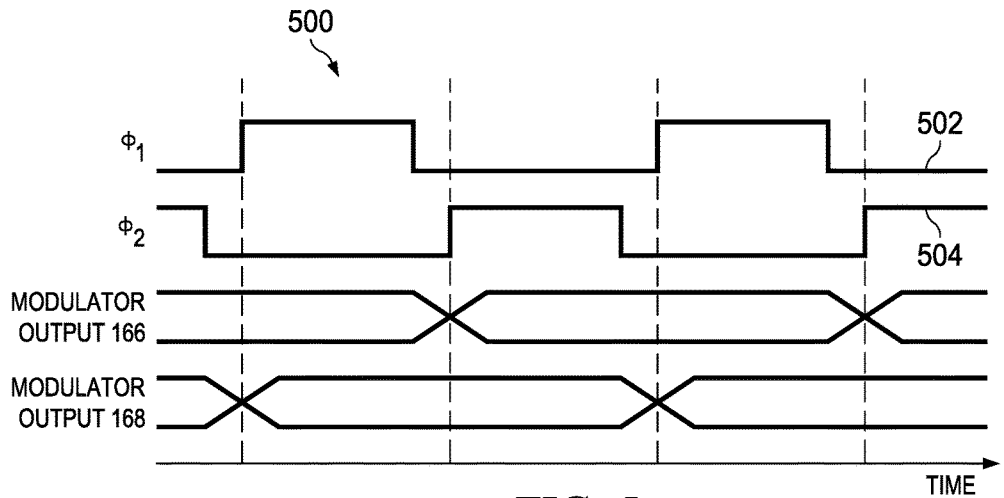
FIG. 5 shows an illustrative timing diagram of various signals of a multiple channel delta-sigma analog-to-digital converter in accordance with various embodiments.

FIG. 5 shows an illustrative timing diagram 500 of various signals 502-504, 166, and 168 of a multiple channel delta-sigma analog-to-digital converter 100 in accordance with various embodiments. In FIG. 5, signal 502 represents an example clock $\Phi_1$ while signal 504 represents an example clock $\Phi_2$. Signals 166 is the modulator output from modulator 402 for a differential analog input pair $V_{INP1}$ and $V_{INM1}$ comprising analog input signal 162. Similarly, signals 168 is the modulator output from modulator 404 for a differential analog input pair $V_{INP2}$ and $V_{INM2}$ comprising analog input signal 164. As discussed above, when $\Phi_1$ is HIGH, $\Phi_2$ is LOW and vice versa because $\Phi_1$ and $\Phi_2$ are non-overlapping. The modulator output signals 166 and 168 may in some embodiments, be the digital output signals 170 and 172 and/or may be filtered to generate two digital output signals 170 and 172. By sharing the operational amplifier 410, the two modulators 402-404 may, in some embodiments, produce the same SNR as conventional multiple channel delta-sigma ADCs but consume as much as 40% less power.

Figure 6:
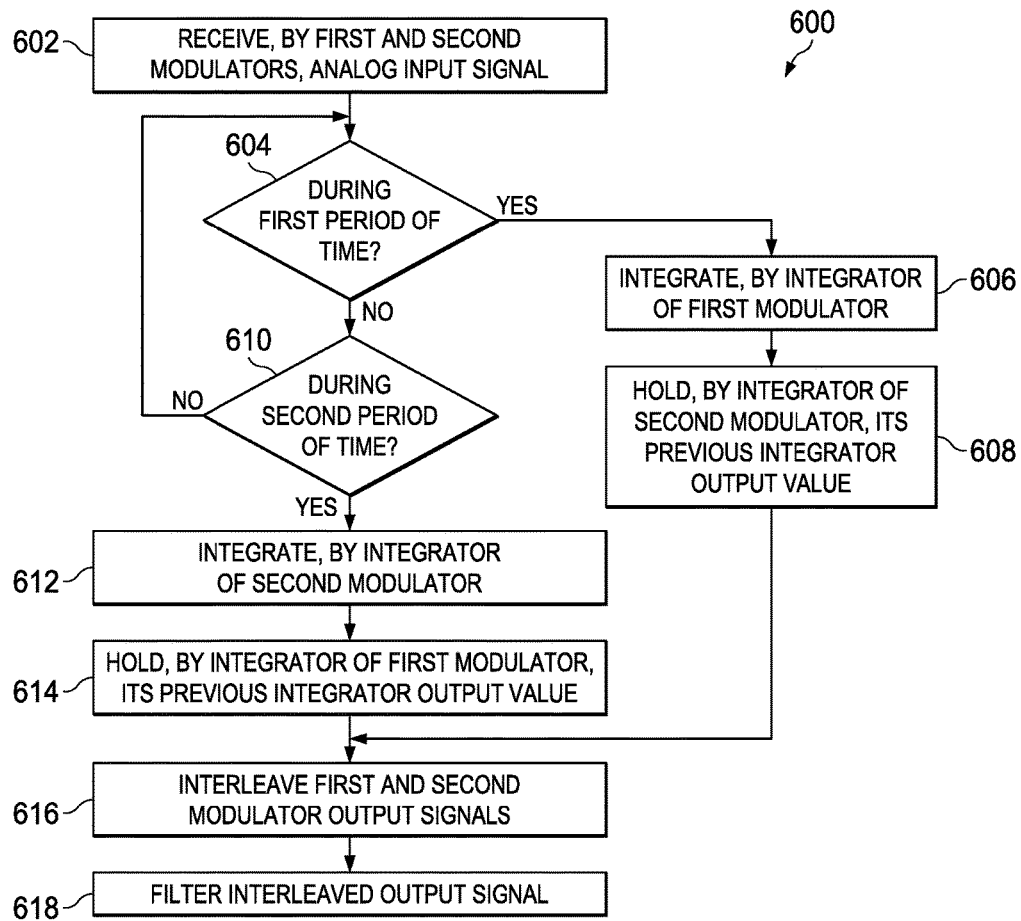
FIG. 6 shows an illustrative flow diagram of a method for converting an analog signal to a digital signal in accordance with various embodiments.

FIG. 6 shows an illustrative flow diagram of a method 600 for converting an analog signal to a digital signal in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 600, as well as other operations described herein, can be performed by single channel delta-sigma modulator 102, multiple channel delta-sigma modulator 152, modulators 202-204, modulators 402-404, integrators 225 and 235, integrators 425 and 435, shared operational amplifiers 210 and 410, and/or low power operational amplifiers 206-208 and 406-408 and implemented in logic and/or by a processor executing instructions stored in a non-transitory computer readable storage medium.

The method 600 begins in block 602 with receiving, by first and second modulators, an analog input signal. For example, modulators 202-204 may receive analog input signal 122 which, in some embodiments, is a differential pair of signals. In block 604, the method 600 continues with determining whether the system is in a first period of time. For example, if the sampling clock $\Phi_1$ is HIGH and the $\Phi_2$ is LOW, then the system is in the first period of time; however, if the sampling clock $\Phi_1$ is LOW and $\Phi_2$ is HIGH, then the system is in a second period of time.

If, in block 604, a determination is made that the system is in a first period of time, then the method 600 continues in block 606 with integrating, by the first modulator. For example, integrator 225 in modulator 202 may integrate the difference between analog input signal 122 and the current modulator output signal 124 utilizing the shared operational amplifier 210, which is switched for use by integrator 225, in combination with low power operational amplifier 206 to generate the integrator output signal 221 which, after being processed by the additional integrators 280 and converted by the sub-ADC 282 becomes the next modulator output signal 124. In block 608, the method continues with holding, by the previous output value of the first integrator in the second modulator (e.g., integrator 235), by a low power amplifier in the first integrator in the second modulator. For example, because the shared operational amplifier 210 is being utilized by integrator 225 during the first period of time, integrator 235 utilizes the low power operational amplifier 208, and in some embodiments, only the low power operational amplifier 208 to hold the previous integrator output signal 231.

If, in block 604, a determination is made that the system is not in a first period of time, then the method 600 continues in block 610 with a determination of whether the system is in the second period of time. For example, if the sampling clock $\Phi_2$ is HIGH and the $\Phi_1$ is LOW, then the system is in the second period of time. If, in block 610, a determination is made that the system is not in the second period of time, then the method 600 continues in block 604 with determining whether the system is in the first period of time. However, if, in block 610, a determination is made that the system is in the second period of time, then the method 600 continues in block 612 with integrating, by the first integrator in the second modulator. For example, integrator 235 may integrate the difference between the analog input signal 122 and the current modulator output signal 130 utilizing the shared operational amplifier 210, which is switched for use by integrator 235, in combination with low power operational amplifier 208 to generate the integrator output signal 231 which, after being processed by the additional integrators 290 and converted by the sub-ADC 292 becomes the next modulator output signal 130. In block 614, the method continues with holding, by the previous output value of the first integrator in the first modulator (e.g., integrator 225), by the low power amplifier of the first integrator in the first modulator. For example, because the shared operational amplifier 210 is being utilized by integrator 235 during the second period of time, integrator 225 utilizes the low power operational amplifier 206, and in some embodiments, only the low power operational amplifier 206 to hold the previous integrator output signal 221.

The method continues in block 616 with interleaving the first and second modulator output signals. For example, interleaver 106 may receive the modulator output signals 124 and 130 and interleave those signals to generate an interleaved output signal 128. In block 618, the method 600 continues with filtering the interleaved output signal. For example, the decimation filter 108 may decimate the interleaved output signal 128, in some embodiments utilizing OSR two times of a conventional single modulator ADC.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A dual delta-sigma analog-to-digital converter (ADC), comprising:
a dual delta-sigma modulator configured to receive an analog input signal, the dual delta-sigma modulator including:
a first modulator including a first integrator configured to integrate a difference between the analog input signal and a current modulator output signal of the first modulator during a first period of time, hold a first integrator output value by a first low power amplifier during a second period of time, and generate a first modulator output signal;
a second modulator including a second integrator configured to hold a second integrator output value during the first period of time, integrate a difference between the analog input signal and a current modulator output signal of the second modulator during the second period of time, and generate a second modulator output signal; and
a shared operational amplifier configured to assist the first modulator during the first period of time and to assist the second modulator during the second period of time;
an interleaver configured to interleave the first modulator output signal and the second modulator output signal to generate an interleaved output signal; and
a decimation filter configured to filter and decimate the interleaved output signal to generate a digital output signal.

2. The dual delta-sigma ADC of claim 1, wherein the decimation filter is configured to filter and decimate the interleaved output signal utilizing an over-sampling ratio (OSR).

3. The dual delta-sigma ADC of claim 1, wherein the first modulator includes a first low power operational amplifier configured to:
integrate the difference between the analog input signal and the current modulator output signal of the first modulator during the first period of time with assistance of the shared operational amplifier; and hold the first integrator output value without assistance of the shared operational amplifier during the second period of time.

4. The dual delta-sigma ADC of claim 3, wherein the second modulator includes a second low power operational amplifier configured to:

integrate the difference between the analog input signal and the current modulator output signal of the second modulator during the second period of time with assistance of the shared operational amplifier; and hold the second integrator output value without assistance of the shared operational amplifier during the second period of time.

5. The dual delta-sigma ADC of claim 4, wherein approximately 85% of total integrator power of the first and second integrators of the dual delta-sigma modulator is consumed by the shared operational amplifier and the first low power operational amplifier and approximately 15% of total integrator power of the first and second integrators of the delta-sigma modulator is consumed by the second low power operational amplifier during the first period of time.

6. The dual delta-sigma ADC of claim 1, wherein the decimation filter is further configured to attenuate high frequency out of band noise in the interleaved output signal prior to decimating the interleaved output signal.

7. The dual delta-sigma ADC of claim 1, wherein the first period of time corresponds with a first sampling clock signal being HIGH, the first sampling clock signal configured to provide a sampling clock to the first modulator.

8. The dual delta-sigma ADC of claim 7, wherein the second period of time corresponds with a second sampling clock signal being HIGH and the first sampling clock signal being LOW, the second sampling clock signal configured to provide a sampling clock to the second modulator.

9. The dual delta-sigma ADC of claim 1, wherein the dual delta-sigma modulator is a single channel ADC.

10. A dual delta-sigma modulator, comprising:
a first modulator configured to generate a first modulator output signal;
a second modulator configured to generate a second modulator output signal; and
a shared operational amplifier coupled to the first modulator and the second modulator, the shared operational amplifier configured to assist a first integrator of the first modulator integrating a difference between a first analog input signal and a first modulator output signal from the first modulator during a first period of time and to assist a second integrator of the second modulator integrating a difference between a second analog input signal and a second modulator output signal from the second modulator during a second period of time.

11. The dual delta-sigma modulator of claim 10, wherein:
the first integrator is configured to receive the first analog input signal, integrate the difference between the first analog input signal and the first modulator output signal during the first period of time, and hold a first integrator output value during a second period of time; and
the second integrator is configured to receive the second analog input signal, integrate the difference between the second analog input signal and the second modulator output signal during the second period of time, and hold a second integrator output value during the first period of time.

12. The dual delta-sigma modulator of claim 11, wherein the dual delta-sigma modulator is a multiple channel dual delta-sigma modulator.

13. The dual delta-sigma modulator of claim 10, wherein the first modulator includes a first low power operational amplifier configured to:

integrate the difference between the first analog input signal and a current modulator output signal of the first modulator during the first period of time with assistance of the shared operational amplifier; and hold the first integrator output value without assistance of the shared operational amplifier during the second period of time.

14. The dual delta-sigma modulator of claim 13, wherein the second modulator includes a second low power operational amplifier configured to:

integrate the difference between the second analog input signal and a current modulator output signal of the second modulator during the second period of time with assistance of the shared operational amplifier; and hold the second integrator output value without assistance of the shared operational amplifier during the second period of time.

15. The dual delta-sigma modulator of claim 14, wherein approximately 85% of total integrator power of the first and second integrators of the dual delta-sigma modulator is consumed by the shared operational amplifier and the first low power operational amplifier and approximately 15% of total amplifier power of the first and second integrators of the delta-sigma modulator is consumed by the second low power operational amplifier during the first period of time.

16. The dual delta-sigma modulator of claim 10, wherein:
the first period of time corresponds with a first sampling clock signal being HIGH and a second sampling clock signal being LOW, the first sampling clock signal configured to provide a sampling clock to the first modulator and the second sampling clock signal configured to provide a sampling clock to the second modulator; and
the second period of time corresponds with the first sampling clock signal being LOW and the second sampling clock signal being HIGH.

17. A method of converting an analog signal to a digital signal, comprising:
receiving, by a first modulator and a second modulator, an analog input signal;
during a first period of time:
integrating, by a first integrator of the first modulator, a difference between the analog input signal and a first modulator output signal utilizing a shared operational amplifier assisting the first and second modulators; and
holding, by a second integrator of the second modulator, a second integrator output value; and
during a second period of time, exclusive of the first period of time:
integrating, by the second integrator, a difference between the analog input signal and a second modulator output signal utilizing the shared operational amplifier; and
holding, by the first integrator, a first integrator output value.

18. The method of claim 17, further comprising interleaving the first modulator output signal and the second modulator output signal to generate an interleaved output signal.

19. The method of claim 18, further comprising filtering the interleaved output signal to generate a digital output signal.

20. The method of claim 19, wherein filtering the interleaved output signal includes decimating the interleaved output signal utilizing an over-sampling ratio (OSR).

* * * * *